United States Patent
Li et al.

(10) Patent No.: US 9,072,163 B2
(45) Date of Patent: Jun. 30, 2015

(54) HOUSING ASSEMBLY FOR PORTABLE ELECTRONIC DEVICE

(71) Applicant: King Slide Technology Co., Ltd., Kaohsiung (TW)

(72) Inventors: Shun-Ying Li, Kaohsiung (TW); Shu-Chen Lin, Kaohsiung (TW); Shan-Yao Chen, Kaohsiung (TW)

(73) Assignee: King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 13/921,385

(22) Filed: Jun. 19, 2013

(65) Prior Publication Data

US 2014/0375182 A1    Dec. 25, 2014

(51) Int. Cl.
| | |
|---|---|
| *E05C 1/08* | (2006.01) |
| *H05K 5/00* | (2006.01) |
| *G06F 1/16* | (2006.01) |
| *H04M 1/02* | (2006.01) |
| *H01M 2/10* | (2006.01) |

(52) U.S. Cl.
CPC ........... *H05K 5/0013* (2013.01); *H04M 1/0262* (2013.01); *G06F 1/1679* (2013.01); *H04M 1/0252* (2013.01); *H01M 2/1022* (2013.01)

(58) Field of Classification Search
CPC ... G06F 1/1635; G06F 1/1679; G06F 1/1626; G06F 1/1656; H04M 1/0262; H04M 1/0283; H04M 1/0252; H04M 1/0249; H04M 1/0277; H04M 2/1022; H04M 2/10661

USPC ........... 312/223.2, 223.1; 292/137, 138, 163, 292/174, 175, DIG. 11, DIG. 37; 361/679.55, 679.56, 679.58

See application file for complete search history.

(56) References Cited

U.S. PATENT DOCUMENTS

| | | | |
|---|---|---|---|
| 6,898,074 B2 * | 5/2005 | Hsu et al. | 361/679.56 |
| 7,072,624 B2 * | 7/2006 | Zheng et al. | 455/90.3 |
| 7,333,777 B2 * | 2/2008 | Qin et al. | 455/90.3 |
| 7,403,802 B2 * | 7/2008 | Park | 455/572 |
| 7,791,879 B2 * | 9/2010 | Jiang et al. | 361/679.58 |
| 7,986,982 B2 | 7/2011 | Li et al. | |
| 8,094,444 B2 * | 1/2012 | Kim et al. | 361/679.3 |
| 8,164,898 B2 * | 4/2012 | Chen et al. | 361/679.55 |
| 8,264,837 B2 | 9/2012 | Pakula et al. | |
| 2010/0317414 A1 * | 12/2010 | Chen et al. | 455/575.1 |
| 2011/0007455 A1 * | 1/2011 | Yang | 361/679.01 |
| 2012/0106035 A1 * | 5/2012 | Chen | 361/679.01 |

* cited by examiner

*Primary Examiner* — Daniel J Troy
*Assistant Examiner* — Andrew Roersma
(74) *Attorney, Agent, or Firm* — Rosenberg, Klein & Lee

(57) ABSTRACT

A housing assembly for a portable electronic device includes a first body, a second body, a first engaging member, a first resilient member and a first housing. The first body has a first space. The second body is installed to the first body and has a first release hole. The first engaging member is movably located in the first space. The first engaging member has at least one first engaging portion. The first resilient member provides a force to the first engaging member to orient the first engaging member toward the first release hole. The first housing is connected to the second body and has at least one first contact portion. When assembling, the first contact portion contacts the first engaging portion. The force of the first resilient member applied to the first engaging member to firmly connect the first housing to the second body.

11 Claims, 10 Drawing Sheets

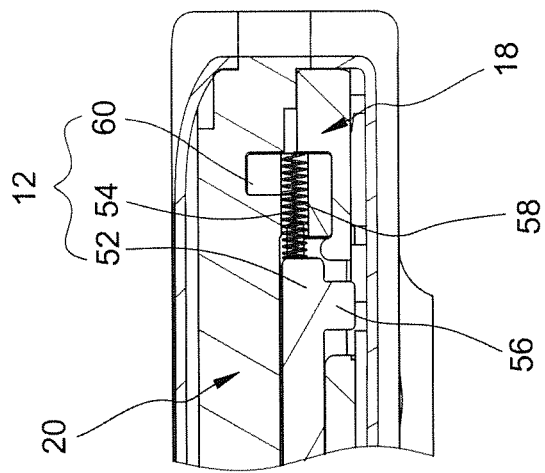
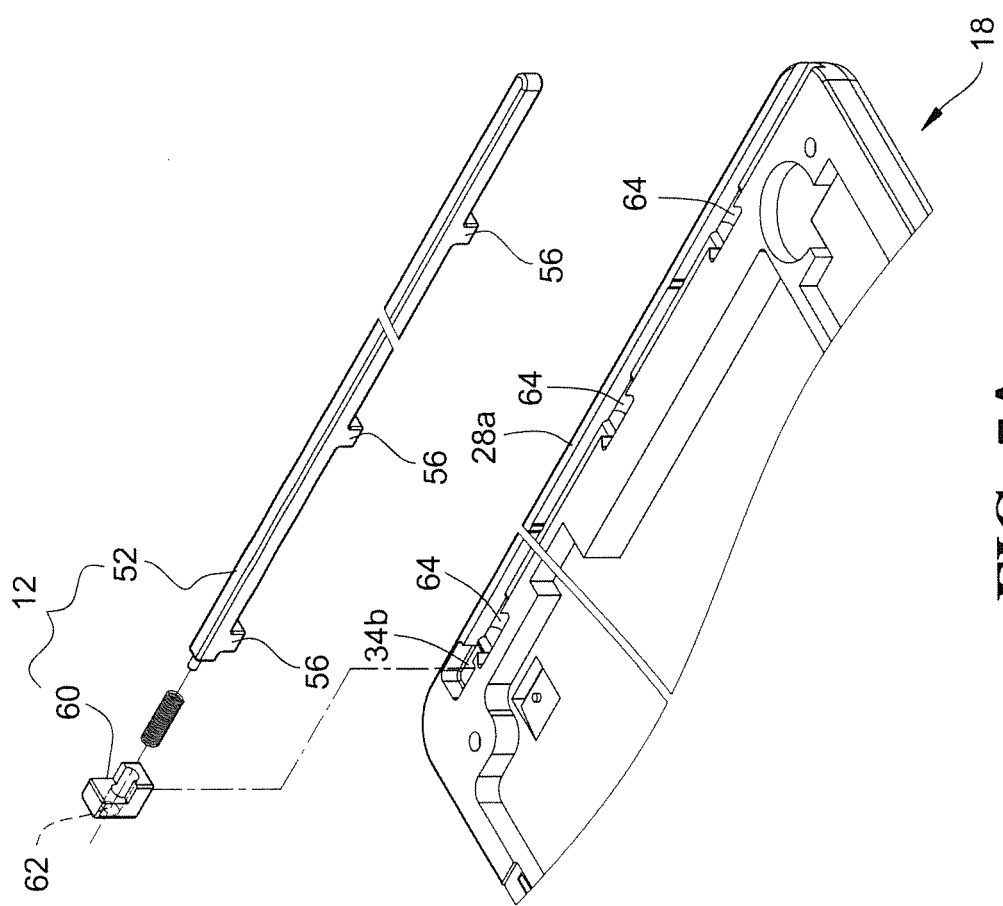
FIG. 5B
FIG. 5A

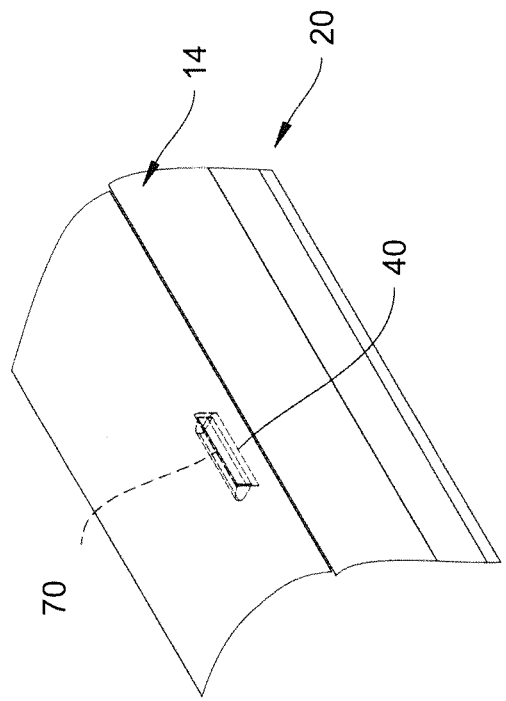
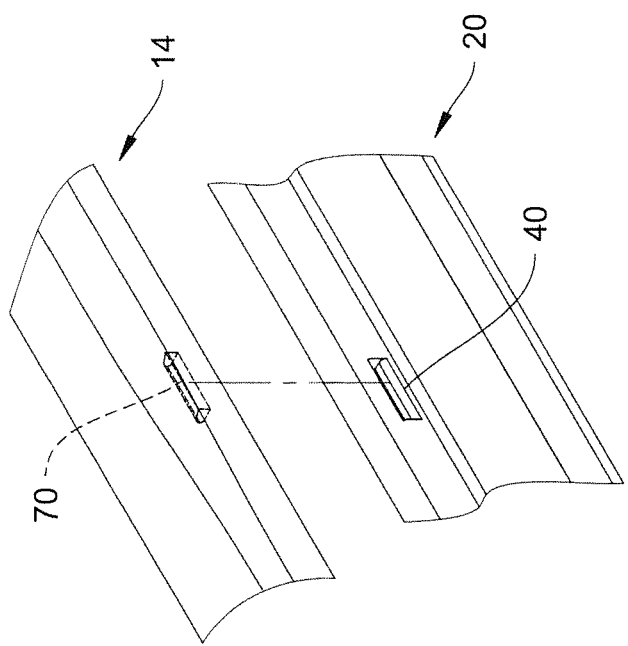
FIG. 7B
FIG. 7A

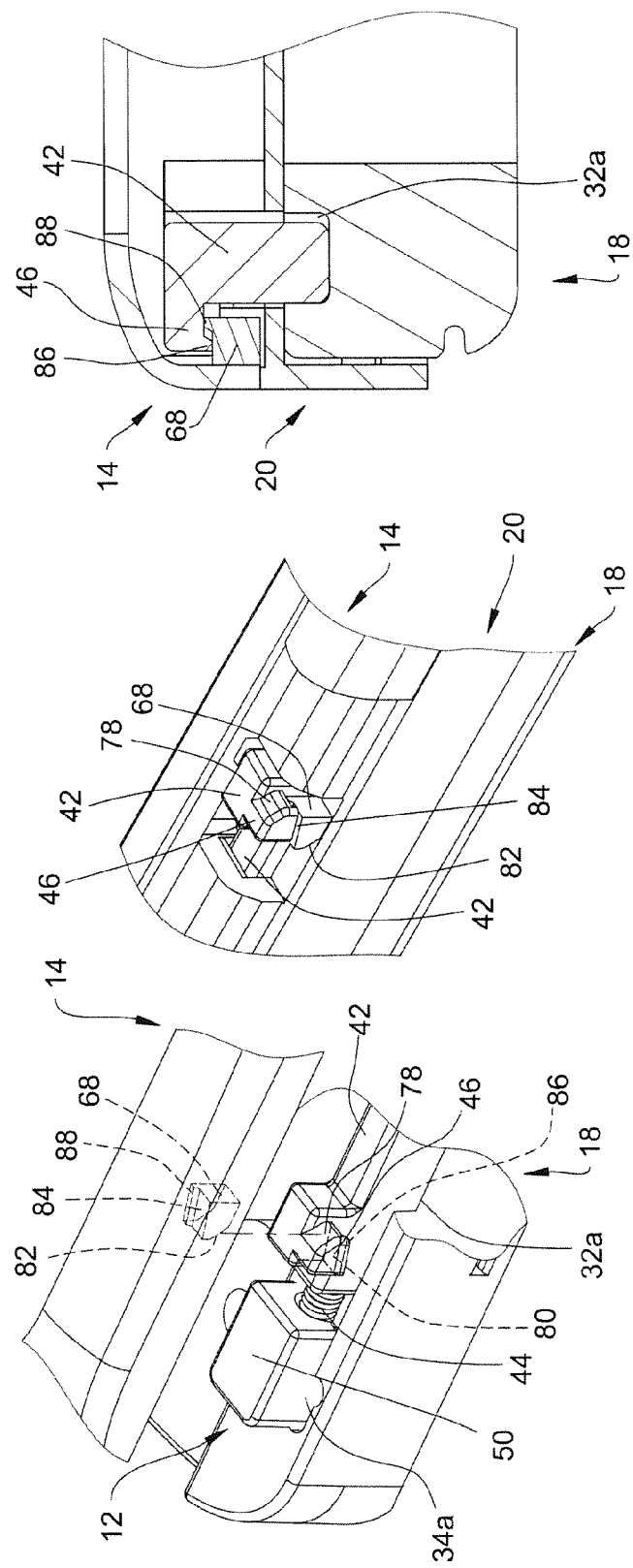

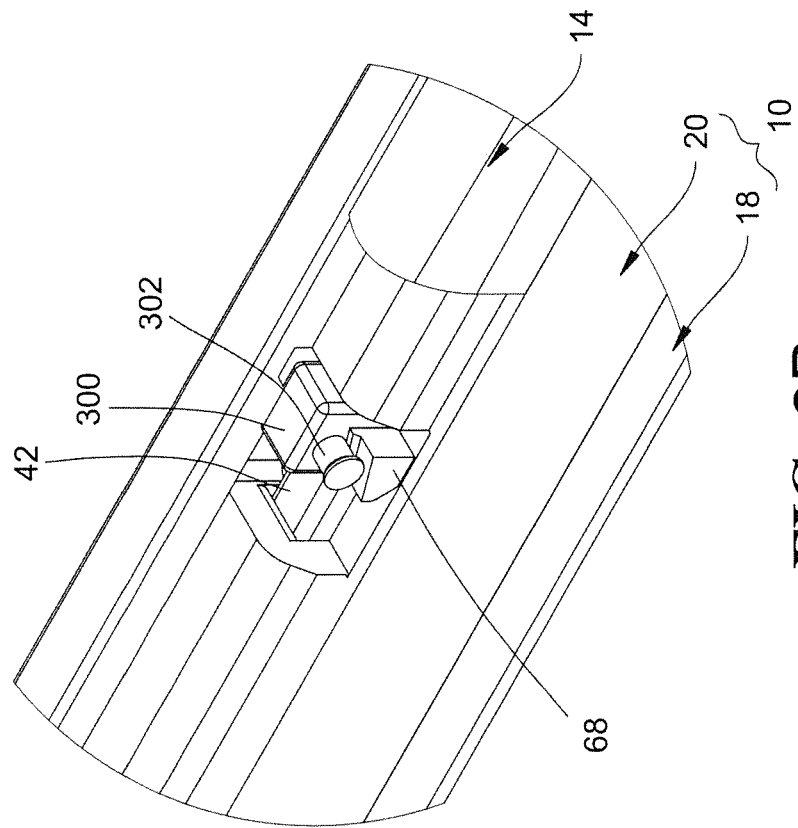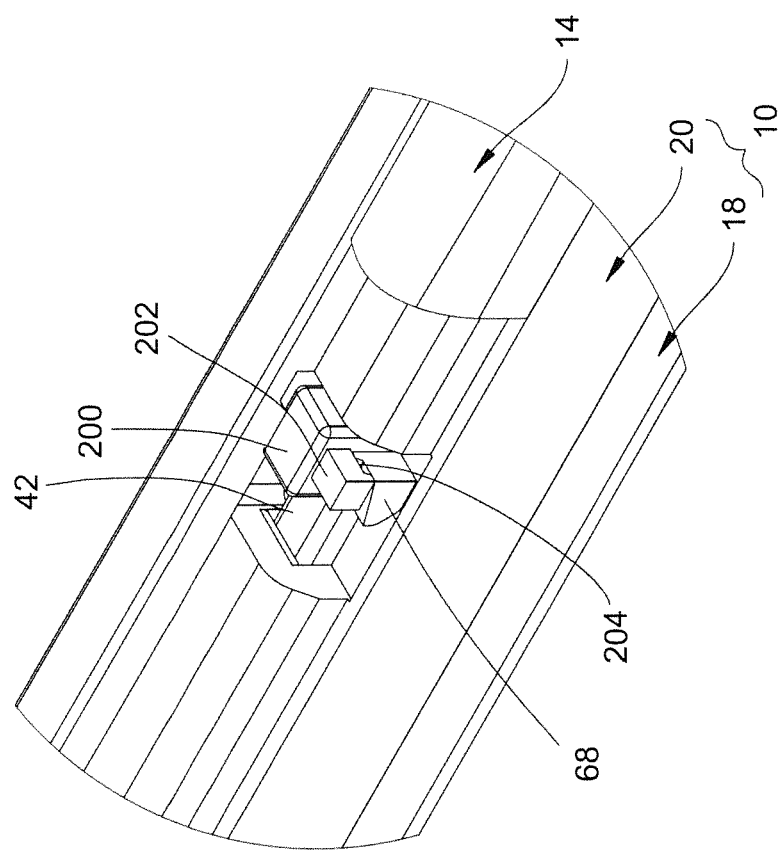

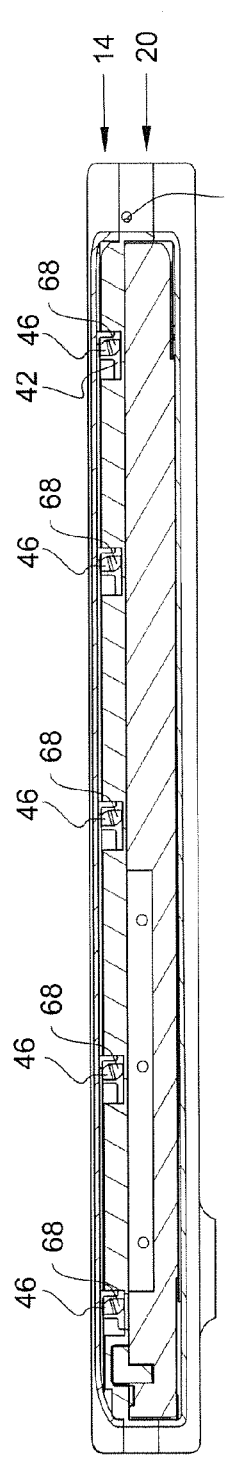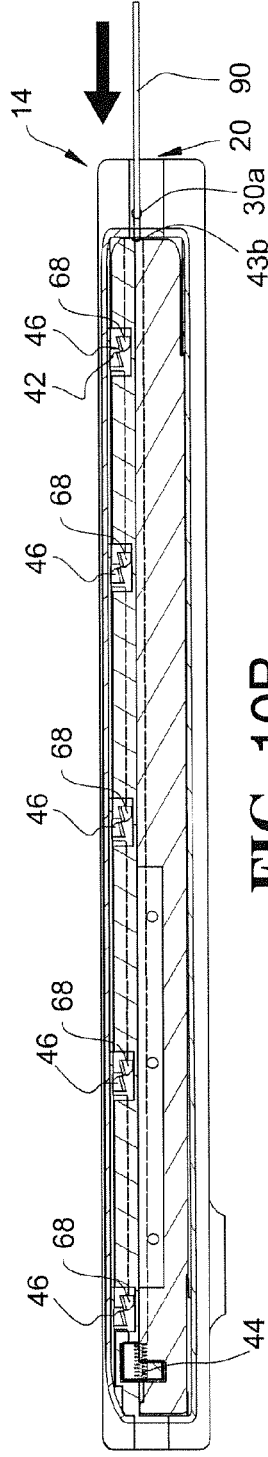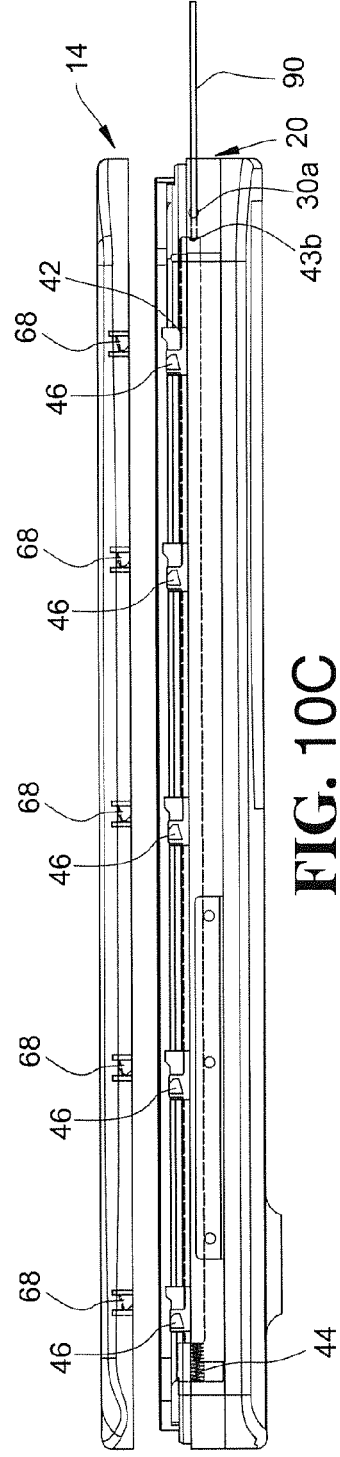

HOUSING ASSEMBLY FOR PORTABLE ELECTRONIC DEVICE

FIELD OF THE INVENTION

The present invention relates to a housing assembly for a portable electronic device.

BACKGROUND OF THE INVENTION

The conventional housing assembly for a portable electronic device is assembled by use of screws. However, the use of screws to assemble and disassemble the housings takes time, and the screws cannot be guaranteed to be secured by the same tightening force.

U.S. Pat. No. 8,164,898 B2 to Chen discloses the housing assembly which does not use screws, but the housing assembly is complicated.

The present invention intends to provide a housing assembly for a portable electronic device, and the assembly is more simple and easily to be assembled and disassembled.

SUMMARY OF THE INVENTION

The present invention relates to a housing assembly for a portable electronic device and comprises a first body having a first side and a second side which is located corresponding to the first side. The first side has a first space. A second body is installed to the first body and has a first release hole and at least one first hole which is located corresponding to the first space of the first body. A first engaging member is movably located in the first space of the first body and has at least one first engaging portion which is located corresponding to the at least one first hole of the second body. The first engaging member is located corresponding to the first release hole of the second body. A first resilient member provides a force to the first engaging member to orient the first engaging member toward the first release hole of the second body. A first housing is connected to the second body and has a first side and a second side. The first side of the first housing has at least one first contact portion which is located corresponding to the at least one first engaging portion of the first engaging member. When assembling, the at least one first contact portion of the first housing contacts the at least one first engaging portion of the first engaging member. By the force of the first resilient member applied to the first engaging member, the first housing is firmly connected to the second body.

Preferably, the first space is substantially parallel to the first side of the first body and extends along the length of the first side of the first body.

Preferably, a first fixing member is disposed to the first body and has a first recess in which the first resilient member is partially received.

Preferably, the at least one first engaging portion of the first engaging member has a first contact face, and the at least one first contact portion has a second contact face which contacts the first contact face.

Preferably, one of the first contact face of the at least one first engaging portion and the second contact face of the at least one first contact portion is an inclined face.

Preferably, a first protrusion extends from a portion of the first contact face of the at least one first engaging portion and contacts the second contact face of the at least one first contact portion.

Preferably, a second protrusion extends from a portion of the second contact face of the at least one first contact portion and contacts the first contact face of the at least one first engaging portion.

Preferably, the at least one first engaging portion of the first engaging member has a first guide face, and the at least one first contact portion has a second guide face which is located corresponding to the first guide face so as to guide movement of the at least one first engaging portion of the first engaging member.

Preferably, one of the first and second guide faces is an inclined face.

Preferably, the at least one first engaging portion is a cylindrical body and the first guide face is a curved face.

Preferably, the at least one first engaging portion is a rectangular body and the first guide face is one side of the rectangular body.

Preferably, the first side of the first body has at least one first connection part. The second side of the second body has at least one second connection part. The second side of the first housing has at least one first connection portion which is connected to the at least one second connection part of the second body.

Alternatively, the present invention provides a housing assembly for a portable electronic device and comprises a first body having a first side and a second side which is located corresponding to the first side. The first side has at least one first connection part. The second side has at least one first hole. The second body has a first side and a second side, and the first and second sides of the second body located corresponding to the first and second sides of the first body respectively. The first side of the second body has a first release hole and at least one first hole. The second side of the second body has a second release hole and at least one second connection part. A first engaging member is movably connected between the first and second bodies. The first engaging member is located corresponding to the first release hole of the second body. The first engaging member has at least one first engaging portion which is located corresponding to the at least one first hole of the second body. A first resilient member provides a force to the first engaging member to orient the first engaging member toward the first release hole of the second body. A second engaging member is movably connected between the first and second bodies. The second engaging member is located corresponding to the second release hole of the second body. The second engaging member has at least one second engaging portion which is located corresponding to the at least one second hole of the first body. A second resilient member provides a force to the second engaging member to keep the second engaging member at a pre-set position. The second engaging member is located corresponding to the second release hole of the second body. A first housing is connected to the second body and has a first side and a second side. The first side of the first housing has at least one first contact portion which is located corresponding to the at least one first engaging portion of the first engaging member. The second side of the first housing has at least one first connection portion which is located corresponding to the at least one second connection part of the second body. A second housing is connected to the first body and has a first side and a second side. The first side of the second housing has at least one second connection portion which is located corresponding to the at least one first connection part of the first body. The second side of the second housing has at least one second contact portion which is located corresponding to the at least one second engaging portion of the second engaging member. When the first housing is connected to the second body, the at least one first connection portion of the first housing is connected to the at least one second connection part of the second body. The at least one first contact portion of the first housing is firmly connected to the at least one first engaging portion of the first engaging member by the force of the first resilient member applied to the first engaging member, so that the first housing is securely connected to the second body. When the second housing is connected to the first body, the at least one second connection portion of the second housing is connected to the at least one first connection part of the first body. The at least one second contact portion of the second housing is firmly connected to the at least one second engaging portion of the second engaging member by the force of the second resilient member applied to the second engaging member, so that the second housing is securely connected to the first body.

Preferably, the at least one first engaging portion of the first engaging member has a first contact face, and the at least one first contact portion has a second contact face. A first protrusion extends from a portion of the first contact face of the at least one first engaging portion. The first protrusion contacts the second contact face of the at least one first contact portion. A second protrusion extends from a portion of the second contact face of the at least one first contact portion. The second protrusion contacts the first contact face of the at least one first engaging portion.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 5A is an exploded view to show the second engaging member and the first body of the housing assembly of the present invention;

FIG. 5B is a cross sectional view to show that the second engaging member is installed to the body of the present invention;

FIG. 7A is an exploded view to show the second side of the first housing and the second body of the present invention;

FIG. 7B is a perspective view to show that the second side of the first housing is installed to the second body of the present invention;

FIG. 8A is an exploded view to show the first side of the first housing and the first engaging member on the first body of the present invention;

FIG. 8B is a perspective view to show that the first side of the first housing is connected to the first engaging member on the first body of the present invention;

FIG. 8C is a cross sectional view to show that the first side of the first housing is connected to the first engaging member on the first body of the present invention;

FIG. 9A is a perspective view to show that the first side of the first housing connected to the second embodiment of the first engaging member on the first body of the present invention;

FIG. 9B is a perspective view to show that the first side of the first housing connected to the third embodiment of the first engaging member on the first body of the present invention;

FIG. 10A shows that the first housing is connected to the body;

FIG. 10B shows that a tool is inserted into the body to disassemble the first housing from the body, and FIG. 10C shows that the first housing is separated from the body by the inserted tool.

DETAILED DESCRIPTION OF THE PREFERRED EMBODIMENT

Figure 1:
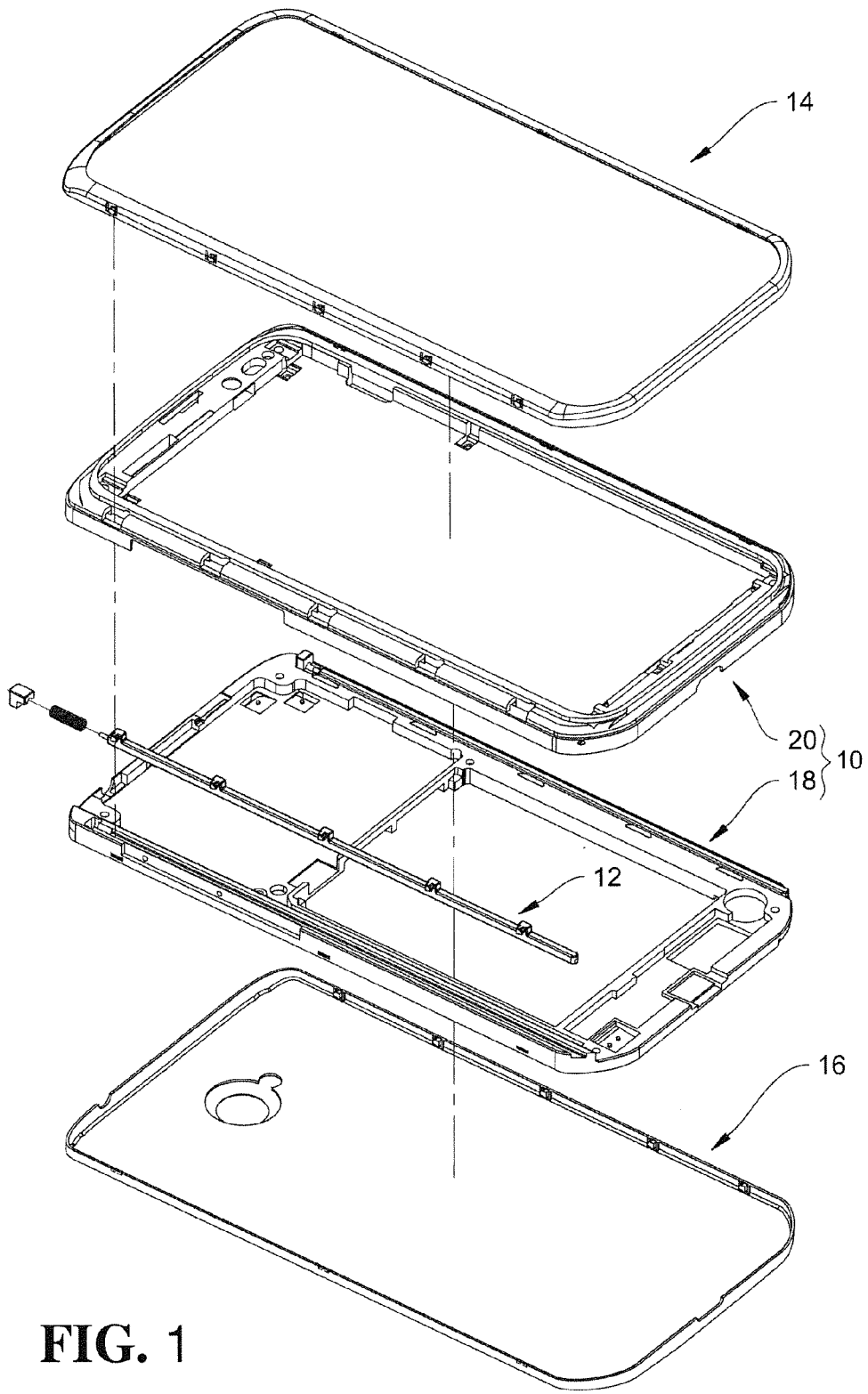
FIG. 1 is an exploded view to show the housing assembly of the present invention.

FIG. 1 shows that the present invention comprises a body 10, an engaging assembly 12, a first housing 14 and a second housing 16. The body 10 comprises a first body 18 and a second body 20.

Figure 2:
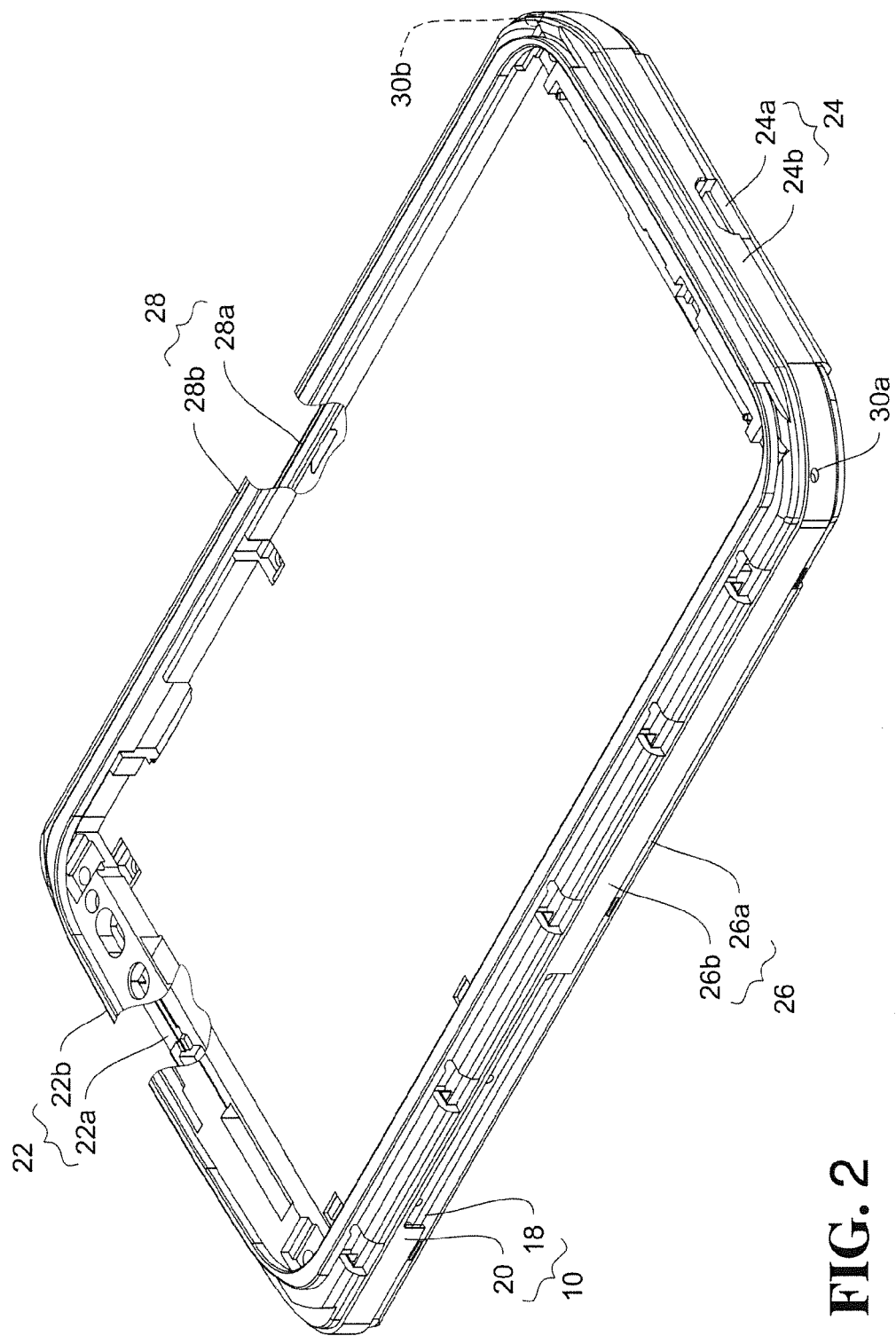
FIG. 2 is a perspective view to show the body of the electronic device.

FIG. 2 shows that the body 10 comprises the first body 18 and the second body 20 which is firmly connected to the first body 18. The first body 18 has a top portion 22a, a bottom portion 24a, a first side 26a and a second side 28a which is located corresponding to the first side 26a. The second body 20 is configured to be correspondent to the first body 18, and the second body 20 has a top portion 22b, a bottom portion 24b, a first side 26b and a second side 28b which is located corresponding to the first side 26b. The top portion 22a of the first body 18 and the top portion 22b of the second body 20 form the top portion 22 of the body 10. The bottom portion 24a of the first body 18 and the bottom portion 24b of the second body 20 form the bottom portion 24 of the body 10. The first side 26a of the first body 18 and the first side 26b of the second body 20 form the first side 26 of the body 10. The second side 28a of the first body 18 and the second side 28b of the second body 20 form the second side 28 of the body 10. The first and second sides 26b, 28b of the second body 20 respectively have a first release hole 30a and a second release hole 30b for a tool to be inserted therein.

Figure 3:
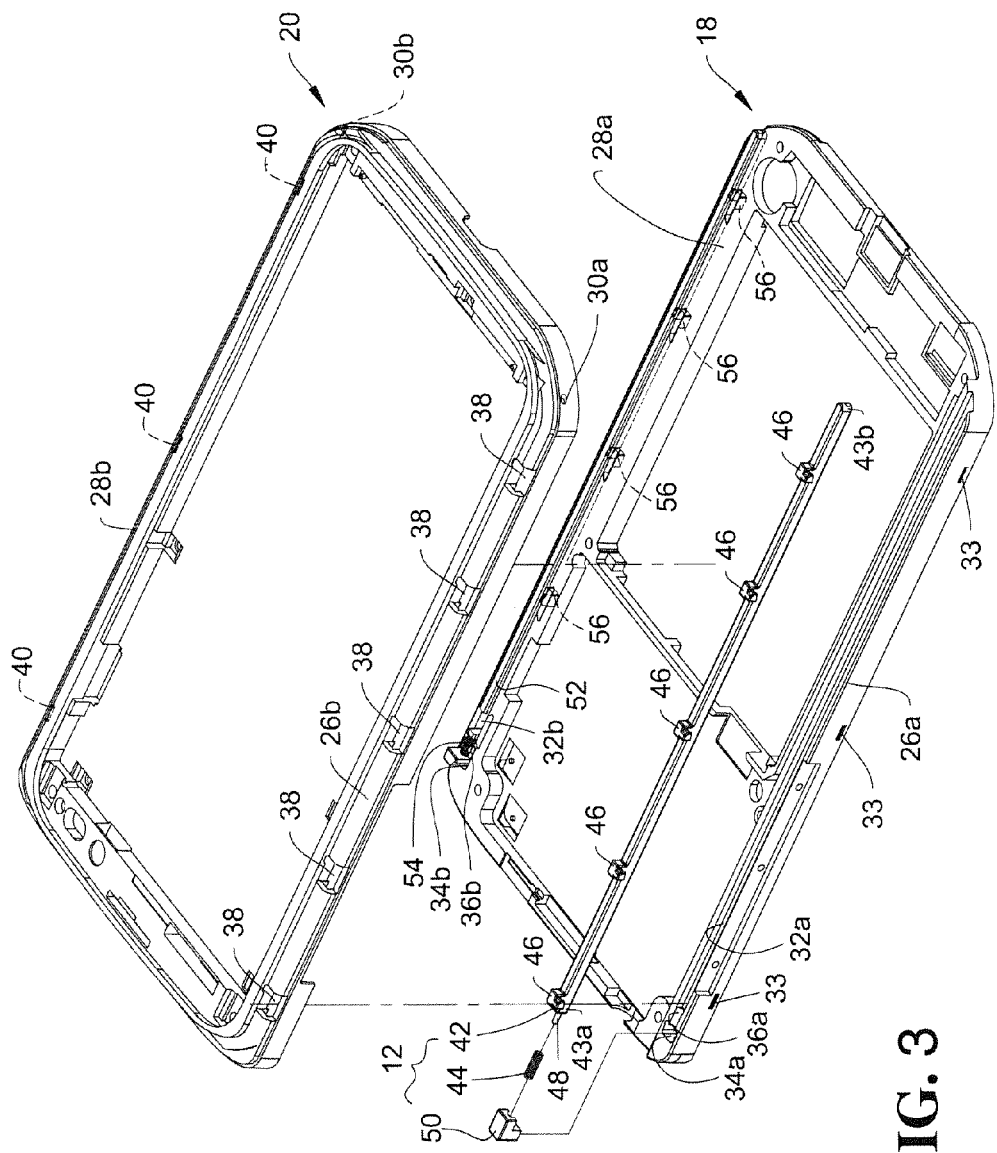
FIG. 3 is an exploded view to show the engaging assembly and the body of the present invention.

FIG. 3 shows that the first side 26a of the first body 18 has a first space 32a and at least one first connection part 33. The first space 32a is substantially parallel to the first side 26a of the first body 18. Preferably, the first space 32a extends along the length of the first side 26a of the first body 18. Preferably, the first body 18 has multiple first connection parts 33. In one embodiment, the first connection part 33 is a hole. The second side 28a of the first body 18 has a second space 32b which is substantially parallel to the second side 28a of the first body 18. Preferably, the first side 26a of the first body 18 has a first groove 34a and a first passage 36a which is connected between the first space 32a and the first groove 34a. Preferably, the second side 28a of the first body 18 has a second groove 34b and a second passage 36b which is connected between the second space 32b and the second groove 34b.

The first side 26b of the second body 20 has at least one first hole 38 which is located corresponding to the first space 32a of the first body 18. The second side 28b of the second body 20 has at least one second connection part 40. Preferably, there are multiple first holes 38 and multiple second connection parts 40 arranged on the second body 20. In one embodiment, the second connection part 40 is a hole.

The engaging assembly 12 comprises a first engaging member 42 and a first resilient member 44. The first engaging member 42 is located between the first and second bodies 18, 20. More specifically, the first engaging member 42 has a first end 43a, a second end 43b which is located corresponding to the first end 43a, and at least one first engaging portion 46 which is located corresponding to the first hole 38 of the second body 20. The first resilient member 44 is disposed between the first body 18 and the first engaging member 42. Preferably, the first end 43a of the first engaging member 42 has a projection 48 which is located corresponding to the first resilient member 44. It is noted that the projection 48 is optionally used to assist the first resilient member 44 to be disposed between the first body 18 and the first engaging member 42. The second end 43b of the first engaging member 42 is located corresponding to the first release hole 30a. Preferably, a first fixing member 50 is located corresponding to the first groove 34a of the first body 18. Preferably, the first engaging member 42 has multiple first engaging portions 46 located corresponding to the multiple first holes 38 of the second body 20.

In one preferable embodiment, the engaging assembly 12 further has a second engaging member 52 and a second resilient member 54. The second engaging member 52 is located corresponding to the second release hole 30b of the body 10. The second engaging member 52 has at least one second engaging portion 56 located in the second space 32b of the second side 28a of the first body 18. The second resilient member 54 is located between the first body 18 and the second engaging member 52. The second engaging member 52 is kept at a pre-set position and located corresponding to the second release hole 30b of the second body 20 by the force of the second resilient member 54 applied to the second engaging member 52. Preferably, the second engaging member 52 has multiple second engaging portions 56.

Figure 4B:
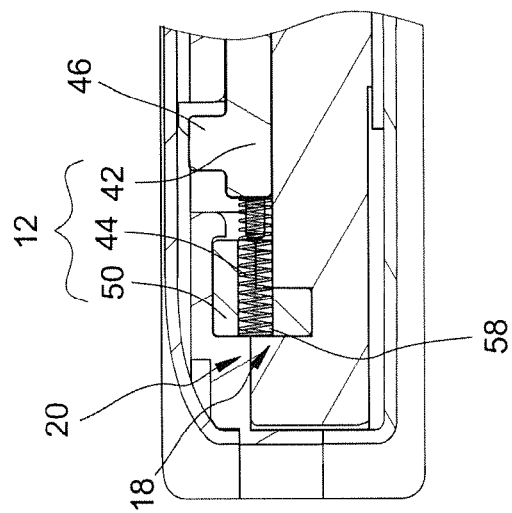
FIG. 4B is a cross sectional view to show that the first engaging member is installed to the body of the present invention.
Figure 4A:
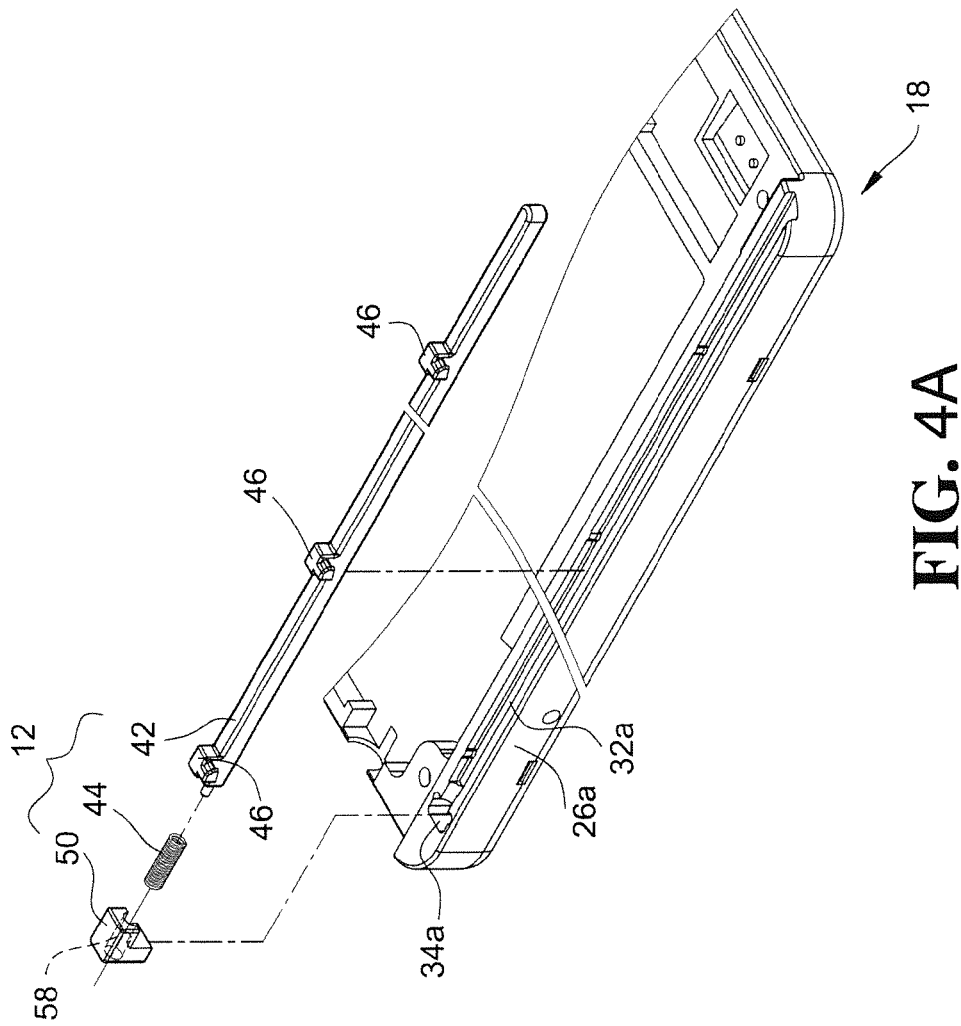
FIG. 4A is an exploded view to show the first engaging member and the first body of the present invention.

As shown in FIGS. 4A and 4B, the first fixing member 50 of the engaging assembly 12 is installed to the first groove 34a of the first side 26a of the first body 18, and the first engaging member 42 is installed to the first space 32a of the first side 26a of the first body 18. The first fixing member 50 has a recess 58 for receiving a portion of the first resilient member 44. The first resilient member 44 provides a force to the first engaging member 42, and by the force, the first engaging member 42 is kept at a pre-set position.

As shown in FIGS. 5A and 5B, the engaging assembly 12 has a second fixing member 60 which is installed to the second groove 34b of the second side 28a of the first body 18. The second fixing member 60 has a recess 62 for receiving a portion of the second resilient member 54. The second side 28a of the first body 18 has at least one second hole 64 which is located corresponding to the second engaging portion 56 of the second engaging member 52. Preferably, there are multiple second holes 64 located in the second side 28a of the first body 18. In one embodiment, the multiple second engaging portions 56 of the second engaging member 52 are located corresponding to the multiple second holes 64 of the first body 18. The second resilient member 54 provides a force to contact the second engaging member 52, and by the force, the second engaging member 52 is kept at a pre-set position.

Figure 6:
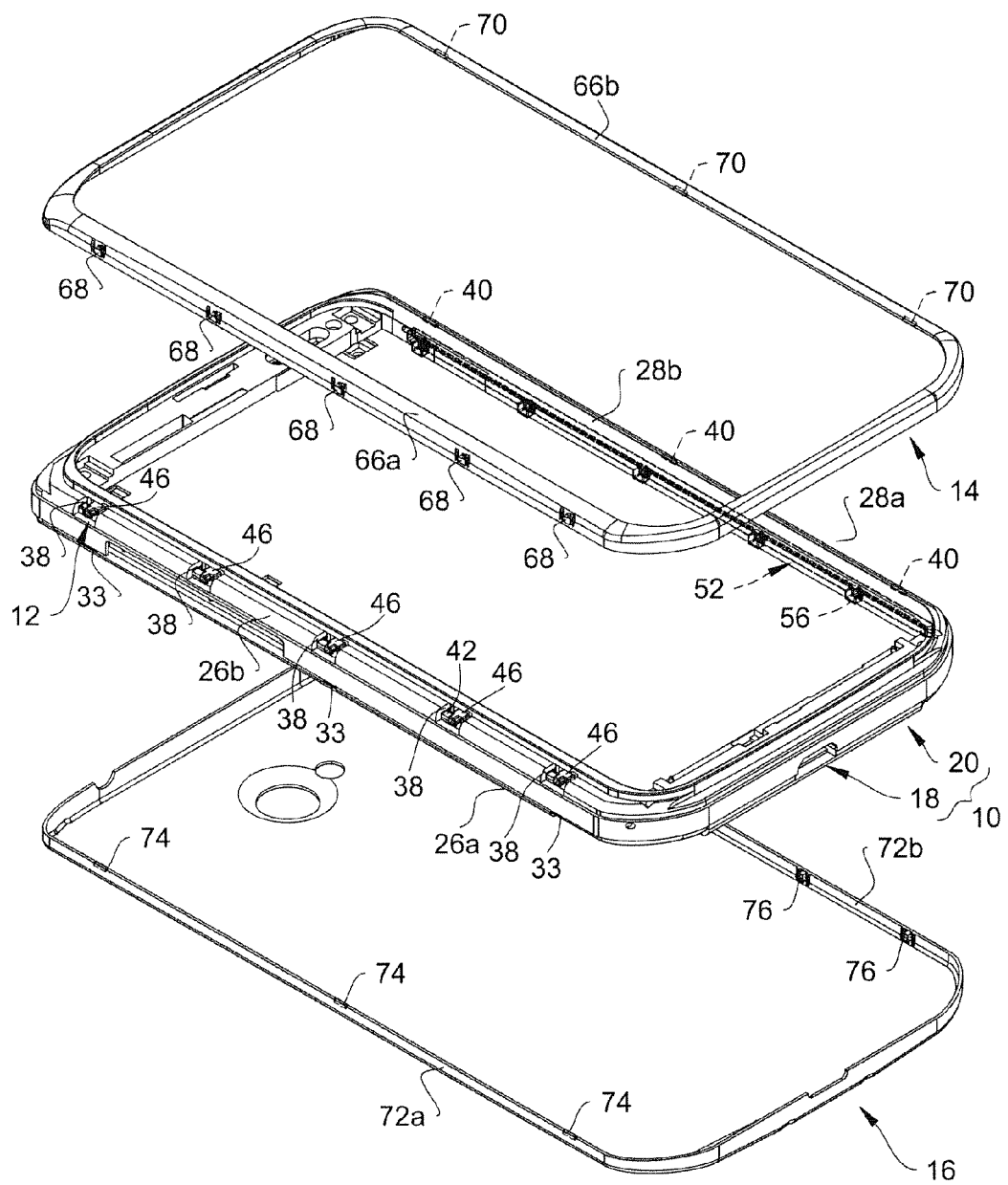
FIG. 6 is an exploded view to show the first housing, the second housing and the body of the present invention.

FIG. 6 shows that the engaging assembly 12 is installed between the first body 18 and the second body 20, in other words, the engaging assembly 12 is installed to the body 10. More specifically, the first engaging portions 46 of the first engaging member 42 of the engaging assembly 12 extend through the first holes 38 of the second body 20. The first housing 14 is connected to the second body 20 and the second housing 16 is connected to the first body 18. In other words, the body 10 is located between the first housing 14 and the second housing 16. The first housing 14 has a first side 66a and a second side 66b, and the first and second sides 66a, 66b are located corresponding to the first and second sides 26b, 28b of the second body 20 respectively. The first side 66a has at least one first contact portion 68 which is located corresponding to the first engaging portion 46 of the first engaging member 42. Preferably, there are multiple first contact portions 68 located on the first housing 14. The second side 66b of the first housing 14 has at least one first connection portion 70 which is located corresponding to the second connection part 40 of the second body 20. Preferably, the first housing 14 has multiple first connection portions 70.

The second housing 16 has a first side 72a and a second side 72b, the first and second sides 72a, 72b are located corresponding to the first and second sides 26a and 28a of the first body 18 respectively. The first side 72a of the second housing 16 has at least one second connection portion 74 which is located corresponding to the first connection part 33 of the first body 18. Preferably, the second housing 16 has multiple second connection portions 74. The second side 72b of the second housing 16 has at least one second contact portion 76 which is located corresponding to the second engaging portion 56 of the second engaging member 52. Preferably, the second housing 16 has multiple second contact portions 76.

As shown in FIGS. 7A and 7B, the first housing 14 has a first connection portion 70 which is engaged with the second connection part 40 of the first housing 14. Preferably, the first connection portion 70 is a protrusion such as a latch.

As shown in FIGS. 8A, 8B and 8C, the first engaging member 42 of the engaging assembly 12 is movably located in the first space 32a of the first body 18, and the first fixing member 50 is located in the first groove 34a of the first body 18. The first resilient member 44 is disposed between the first engaging member 42 and the first fixing member 50 so as to apply a force to the first engaging member 42. More specifically, the first engaging portion 46 of the first engaging member 42 is generally formed as a triangular part and has a first guide face 78 and a first contact face 80. The first guide face 78 is located corresponding to the first contact portion 68 of the first housing 14. Preferably, the first guide face 78 is an inclined face. The first contact face 80 is located corresponding to the first space 32a of the first body 18. When assembling, the first contact portion 68 of the first housing 14 is located corresponding to the first engaging portion 46 of the first engaging member 42. When the first housing 14 is connected to the second body 20, the first connection portion 70 of the first housing 14 is connected to the second connection part 40 of the second body 20 as shown in FIGS. 7A and 7B. Then, the first contact portion 68 of the first housing 14 is pushed to contact to the first engaging portion 46 of the first engaging member 42. By the contact between the first guide face 78 of the first engaging portion 46 and the first contact portion 68 of the first housing 14, the first contact portion 68 of the first housing 14 moves the first guide face 78 of the first engaging portion 46 to push/compress the first resilient member 44 until the first contact portion 68 of the first housing 14 moves over the first guide face 78 of the first engaging portion 46. Subsequently, the first resilient member 44 releases the force to move the first engaging member 42, so that the first contact face 80 of the first engaging portion 46 is engaged with the first contact portion 68 of the first housing 14 to secure the connection between the first housing 14 to the second body 20. In one embodiment, the first contact portion 68 of the first housing 14 has a second guide face 82 and a second contact face 84. The second guide face 82 is an inclined face and located corresponding to the first guide face 78 of the first engaging portion 46 so as to guide the movement of the first engaging portion 46 of the first engaging member 42 easily. The second contact face 84 contacts the first contact face 80 of the first engaging portion 46. Preferably, one of the first contact face 80 of the at least one first engaging portion 46 and the second contact face 84 of the at least one first contact portion 68 is an inclined face. Preferably, a first protrusion 86 extends from a portion of the first contact face 80 of the first contact portion 46, and the first protrusion 86 contacts the second contact face 84 of the first contact portion 68. Preferably, a second protrusion 88 extends from a portion of the second contact face 84 of the first contact portion 68, and the second protrusion 88 contacts the first contact face 80 of the at least one first engaging portion 46. By the above-mentioned arrangement, the first housing 14 can be firmly connected to the second body 20.

FIG. 9A shows the second embodiment of the first engaging portion 200 of the first engaging member 42. The first engaging portion 200 is generally formed as a rectangular body and has a first guide face 202 and a first contact face 204. The first guide face 202 of the first engaging portion 200 of the first engaging member 42 is one side of the rectangular body, and the first contact face 204 is a plane. FIG. 9B shows the third embodiment of the first engaging portion 300 of the first engaging member 42. The first engaging portion 300 of the first engaging member 42 is generally formed as a cylindrical body and has a first guide face 302. The first guide face 302 of the first engaging portion 300 is a curved face of the cylindrical body. When the first housing 14 is connected to the second body 20, the first guide face 302 is pushed by the first contact portion 68 to move the first engaging member 42. The first guide face 302 is then moved by the first resilient member 44 and contacts the first contact portion 68 again so as to firmly connect the first housing 14 to the second body 20. In other words, the first guide face 302 has the same function as the first contact face 80 or 204 in other embodiments.

It is noted that the first guide face 78/202/302 of the first engaging portion 46/200/300 of the first engaging member 42 can be configured to different shapes, such as a plane, an inclined face, a curved face and the combination thereof without departing the scope of the arrangement, among the second body 20, the first engaging member 42 and the first housing 16, so as to easily guide the movement of the first engaging portion 46/200/300 of the first engaging member 42 to engage with the first contact portion 68 of the first housing 14 and hence securely connect the first housing 14 to the second body 20. Similarly, the shapes of the second guide face 82 and the first and second contact faces 80 and 84 can be configured as a plane, an inclined face, a curved face and the combination thereof.

Referring to FIGS. 10A, 10B and 10C, wherein FIG. 10A shows that the first housing 14 is connected to the second body 20. More specifically, the multiple first contact portions 68 of the first housing 14 are connected with the multiple first engaging portions 46 of the first engaging member 42, so that the first housing 14 is firmly connected to the second body 20. When the first housing 14 is to be disassembled from the second body 20, a tool 90 such as thin and long stick is inserted into the first release hole 30a of the body 10 and contacts the second end 43b of the first engaging member 42 which is moved by the tool 90 to overcome the force of the first resilient member 44 until the first engaging member 42 is moved and the first engaging portions 46 are separated from the first contact portions 68 of the first housing 14 (as FIG. 10B shown). Consequently, the first housing 14 can be disassembled from the second body 20, as shown in FIG. 10C.

When the tool 90 no longer pushes the first engaging member 42, the first resilient member 44 releases the force to the first engaging member 42, so that the first engaging member 42 is returned to its initial position.

It is noted that the second housing 16 has the identical functions, mechanisms, and ways of operation with the first housing 14. That is to say, the way for mounting the second housing 16 to the first body 18 or disassembling the second housing 16 from the first body 18 is the same as the interaction between the first housing 14 and the second body 20. More specifically, the first connection part 33 of the first body 18, the second engage portion 56 of the second engage member 52, and the second connection portion 74 and the second contact portion 76 of the second housing 16 can be respectively compared to the second connection part 40 of the second body 20, the first engage portion 46/200/300 of the first engage member 42, and the first connection portion 70 and the first contact portion 68 of the first housing 14. The detailed description for assembling the second housing 16 to the first body 18 is therefore omitted.

While we have shown and described the embodiment in accordance with the present invention, it should be clear to those skilled in the art that further embodiments may be made without departing from the scope of the present invention.

What is claimed is:

1. A housing assembly for a portable electronic device, comprising:
a first body having a first side, and a second side located corresponding to the first side, the first side having a first space;
a second body coupled to the first body, and having a first release hole, and at least one first hole located corresponding to the first space of the first body;
a first engaging member movably located in the first space of the first body, and having at least one first engaging portion located corresponding to the at least one first hole of the second body, the first engaging member being aligned with the first release hole of the second body;
a first resilient member providing a force to the first engaging member to bias the first engaging member with respect to the first release hole of the second body; and
a first housing connected to the second body and having a first side and a second side, the first side of the first housing having at least one first contact portion protruding therefrom toward the at least one first engaging portion of the first engaging member, the at least one first engaging portion of the first engaging member having a first contact face, and the at least one first contact portion has a second contact face which contacts the first contact face, one of the first contact face of the at least one first engaging portion and the second contact face of the at least one first contact portion being an inclined face;
a first protrusion extending from a portion of the first contact face of the at least one first engaging portion and contacting the second contact face of the at least one first contact portion;
wherein in an assembling configuration, the at least one first contact portion of the first housing passes through one first hole of the second body to engage and displace the at least one first engaging portion of the first engaging member, the first housing remaining retentively connected to the second body responsive to the bias force of the first resilient member applied to the first engaging member.

2. The assembly as claimed in claim 1, wherein the first space is substantially parallel to the first side of the first body and extends along a length of the first side of the first body.

3. The assembly as claimed in claim 1, further comprising a first fixing member which is disposed to the first body and has a recess in which the first resilient member is partially received.

4. The assembly as claimed in claim 1, further comprising a second protrusion which extends from a portion of the second contact face of the at least one first contact portion and contacts the first contact face of the at least one first engaging portion.

5. The assembly as claimed in claim 1, wherein the at least one first engaging portion of the first engaging member has a first guide face, and the at least one first contact portion has a second guide face which is located corresponding to the first guide face so as to guide movement of the at least one first engaging portion of the first engaging member.

6. The assembly as claimed in claim 5, wherein one of the first and second guide faces is an inclined face.

7. The assembly as claimed in claim 5, wherein the at least one first engaging portion is a cylindrical body, and the first guide face is a curved face.

8. The assembly as claimed in claim 5, wherein the at least one first engaging portion is a rectangular body, and the first guide face is one side of the rectangular body.

9. The assembly as claimed in claim 1, wherein the first side of the first body has at least one first connection part, the second side of the second body has at least one second connection part, the second side of the first housing has at least one first connection portion which is engaged with the at least one second connection part of the second body.

10. The assembly as claimed in claim 9, further comprising a second housing having a first side and a second side, the first side of the second housing having at least one second contact portion which is located corresponding to the at least one first connection part of the first body.

11. A housing assembly for a portable electronic device, comprising:
   a first body having a first side, and a second side located corresponding to the first side, the first side having at least one first connection part, the second side having at least one second hole;
   a second body coupled to the first body and having a first side and a second side, the first and second sides of the second body located corresponding to the first and second sides of the first body respectively, the first side of the second body having a first release hole and at least one first hole, the second side of the second body having a second release hole and at least one second connection part;
   a first engaging member movably connected between the first and second bodies, the first engaging member being aligned with the first release hole of the second body, the first engaging member having at least one first engaging portion located corresponding to the at least one first hole of the second body;
   a first resilient member providing a force to the first engaging member to bias the first engaging member with respect to the first release hole of the second body;
   a second engaging member movably connected between the first and second bodies, the second engaging member being aligned with the second release hole of the second body, the second engaging member having at least one second engaging portion being aligned with the at least one second hole of the first body;
   a second resilient member providing a force to the second engaging member to bias the second engaging member to a pre-set position;
   a first housing connected to the second body and having a first side and a second side, the first side of the first housing having at least one first contact portion protruding therefrom toward the at least one first engaging portion of the first engaging member, the second side of the first housing having at least one first connection portion located corresponding to the at least one second connection part of the second body, the at least one first engaging portion of the first engaging member having a first contact face, the at least one first contact portion having a second contact face, a first protrusion extending from a portion of the first contact face of the at least one first engaging portion, the first protrusion contacting the second contact face of the at least one first contact portion, a second protrusion extending from a portion of the second contact face of the at least one first contact portion, the second protrusion contacting the first contact face of the at least one first engaging portion; and
   a second housing connected to the first body and having a first side and a second side, the first side of the second housing having at least one second connection portion located corresponding to the at least one first connection part of the first body, the second side of the second housing having at least one second contact portion protruding therefrom toward the at least one second engaging portion of the second engaging member;
   wherein when the first housing is connected to the second body, the at least one first connection portion of the first housing engages the at least one second connection part of the second body, the at least one first contact portion of the first housing passes through one first hole of the second body to engage and displace the at least one first engaging portion of the first engaging member, the first housing remaining retentively connected to the second body responsive to the bias force of the first resilient member applied to the first engaging member,
   wherein when the second housing is connected to the first body, the at least one second connection portion of the second housing engages the at least one first connection part of the first body, the at least one second contact portion of the second housing engages and displaces the at least one second engaging portion of the second engaging member, the second housing remaining retentively connected to the first body responsive to the bias force of the second resilient member applied to the second engaging member.

* * * * *